United States Patent [19]

Slayman et al.

[11] Patent Number: 5,416,412
[45] Date of Patent: May 16, 1995

[54] NUTATION ANGLE MEASUREMENT DURING MRI PRESCAN

[75] Inventors: Beth E. Slayman, Wauwatosa; Kevin F. King, New Berlin; Paul E. Licato, Wauwatosa, all of Wis.

[73] Assignee: General Electric Company, Milwaukee, Wis.

[21] Appl. No.: 129,822

[22] Filed: Sep. 30, 1993

[51] Int. Cl.[6] ............................................ G01R 33/20
[52] U.S. Cl. ................... 324/314; 324/309; 324/313
[58] Field of Search ............... 324/309, 313, 314, 318, 324/307, 300; 128/653.2, 653.5

[56] References Cited

U.S. PATENT DOCUMENTS

| | | | |
|---|---|---|---|
| 4,789,830 | 12/1988 | Stokar | 324/312 |
| 4,799,014 | 1/1989 | Nakabayashi | 324/313 |
| 4,814,708 | 3/1989 | Van et al. | 324/309 |
| 4,866,386 | 9/1989 | Sattin | 324/314 |
| 4,891,594 | 1/1990 | Wilfley et al. | 324/309 |
| 4,983,921 | 1/1991 | Kramer et al. | 324/309 |
| 5,107,215 | 4/1992 | Schaefer et al. | 324/314 |
| 5,260,654 | 11/1993 | Cory | 324/313 |

OTHER PUBLICATIONS

A Rapid, High Signal-To-Noise RF Calibration Scheme, *Proceedings, Society of Magnetic Resonance in Medicine Seventh Annual Meeting*, 1016 (1988), pp. William Sattin.

A Novel Method for Rapid Pulse Angle Optimization, *Proceedings, Society of Magnetic Resonance in Medicine Fourth Annual Meeting*, 1129 (1985), P. van der Meulen, et al.

Rapid Radiofrequency Calibration in MRI, *Magnetic Resonance in Medicine*, 15, 438-445 (1990), J. W. Carlson, et al.

*Primary Examiner*—Sandra O'Shea
*Assistant Examiner*—Raymond Y. Mah
*Attorney, Agent, or Firm*—Quarles & Brady

[57] ABSTRACT

A prescan for an MRI system (FIG. 1) automatically sets the rf power level to produce an excitation field that nutates spins in the image plane the amount prescribed by the scan. Nutation angle is measured with a pulse sequence comprised of three slice selective excitation pulses that produce a set of frequency encoded NMR echo signals ($E_1$, $S_1$, $E_2$, $E_{23}$, $E_{13}$). Nutation angle is calculated at locations in the image slice from the Fourier transformation of these signals and the maximum nutation angle is employed to calculate the final rf power level setting for the scan.

9 Claims, 3 Drawing Sheets

NUTATION ANGLE MEASUREMENT DURING MRI PRESCAN

BACKGROUND OF THE INVENTION

The field of the invention is nuclear magnetic resonance imaging methods and systems. More particularly, the invention relates to the accurate measurement of nutation angle, or flip angle, prior to a scan by an MRI system.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, $M_z$, may be rotated, or "tipped", into the x-y plane to produce a net transverse magnetic moment $M_t$. A signal is emitted by the excited spins after the excitation signal $B_1$ is terminated and this signal may be received and processed to form an image.

When utilizing these signals to produce images, magnetic field gradients ($G_x$ $G_y$ and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

The degree to which the net aligned moment is tipped into the x-y plane is determined by the magnitude of the applied excitation field. The desired "nutation" angle depends on the specific imaging pulse sequence used. For spin echo scans which use rf refocusing pulses, it is common to nutate the nuclei by 90° to get the highest possible signal. For gradient echo scans, it is common to nutate the nuclei by a smaller angle, for example 30° in order to disturb the equilibrium as little as possible. The nutation angle actually resulting from the applied rf magnetic field depends on many factors including the rf power applied to the coil, the shape of the rf magnetic field envelope and the patient shape and proximity to the coil. It is difficult to predict exactly what rf power is needed for the desired nutation angle. Therefore it is common practice to measure the rf power needed in a calibration step performed prior to the MR imaging scan.

Prevailing prescan methods for measuring nutation angle, such as that described in U.S. Pat. No. 5,107,215, acquire a set of 10 to 15 NMR echo signals produced with different rf power settings. The power setting providing the largest signal is assumed to produce a 90° nutation angle, and this power setting may be scaled to produce other nutation angles. Such measurements require 20 to 30 seconds to perform, which is not long when employed with spin echo scans in excess of one minute.

Most MRI scans currently used to produce medical images require many minutes to acquire the necessary data. The reduction of this scan time is an important consideration, since reduced scan time increases patient throughput, improves patient comfort, and improves image quality by reducing motion artifacts. There is a class of pulse sequences which have a very short repetition time (TR) and result in complete scans which can be conducted in seconds rather than minutes. When used with these fast pulse sequences, prevailing prescan methods requiring 20 to 30 seconds are unsatisfactory.

Faster prescan methods, such as those described in U.S. Pat. Nos. 4,814,708 and 4,983,921 have been proposed. These methods use three rf pulses, all of the same nutation angle, causing four separate echoes which are frequency encoded in the slice-select direction. The echoes may be processed in various ways to give estimates of the flip angle resulting from the applied rf power. The rf power needed for any other nutation angle is obtained by scaling the measured value.

The fast methods have several problems. The rf magnetic field varies spatially within the patient, and if the rf power is set so that nuclei are nutated by 90° at a location where the rf field is low, the nutation angle will be significantly greater than this at locations where the rf field is large. The result is noticeable shading in the image. In order to overcome this problem it is necessary to measure the variation of the nutation angle within the imaging plane. Since the fast methods measure the nutation angle orthogonal to this plane, the measured nutation angle corresponds to an average over the imaging plane and may be significantly smaller than the maximum nutation angle within this plane. This will result in the rf power being chosen too high with subsequent shading in the image. A second problem is that prior fast methods have substantially worse SNR than the current slow method. The current slow method has good SNR because the result is obtained by a fit of data from many acquired NMR signals, whereas the fast methods employ two to four NMR signals obtained during a single measurement pulse sequence. A third problem with some of the fast methods is that their result depends strongly on the $T_1$ of the subject. As the $T_1$ becomes shorter, the estimate of nutation angle decreases, causing the rf power used to be correspondingly higher with subsequent shading in the image.

SUMMARY OF THE INVENTION

The present invention is a method and means for rapidly measuring the nutation angle produced by an excitation field in an MRI system, and more particularly, a method and means for setting the rf power level of an MRI system prior to a scan. The present invention includes the application of three excitation field pulses to the region of interest along with a slice select magnetic field gradient, the acquisition of four resulting NMR echo signals in the presence of an orthogonal readout magnetic field gradient, the Fourier transformation of the four NMR echo signals, the calculation of magnitude values from the four transformed NMR echo signals, and the calculation of the nutation angle produced by the first excitation field pulse using magnitude values from the respective NMR echo signals. The rf power level of the MRI system is then adjusted to produce the desired nutation angle.

A general object of the invention is to provide a fast nutation angle measurement for use in the prescan process. The excitation of spins, acquisition of the four NMR echo signals and calculation of nutation angle requires less than 100 msec. The rf power setting for the scan can thus be determined in a very short time in relation to the total scan time.

Another object of the invention is to measure the nutation angle at different locations in the imaging plane. This is accomplished by using a slice select gradient to limit the measurement to the imaging plane, and by applying an orthogonal readout gradient during NMR echo signal acquisition. The Fourier transformed NMR echo signals yield magnitudes at locations in the imaging plane and along the direction of the readout gradient. Different filtering and selection strategies may be employed to select the magnitude values used in the final calculation of nutation angle and to thereby avoid application of an rf power level that is too high at some locations within the imaging plane.

Yet another object of the invention is to provide a nutation angle measurement which has a good SNR. The calculation of the nutation angle is independent of the nutation angles of the second and third excitation field pulses. Therefore, the second and third excitation pulse nutation angles can be set to maximize the SNR of the measurement. In the preferred embodiment the nutation angle of the second and third pulses are set to twice that of the first excitation field pulse.

A more specific object of the invention is to reduce the sensitivity of the measurement to variations in nutation angle along the slice select axis. This is accomplished in part by employing slice select gradients during the application of all three excitation field pulses, but a discovery of the present invention is that further improvement may be achieved by reducing the thickness of the slice selected during the third pulse. In the preferred embodiment, for example, the thickness of the first two slices is 20 mm and the thickness of the third is reduced to 5 mm.

DESCRIPTION OF THE PREFERRED EMBODIMENTS

Figure 1:
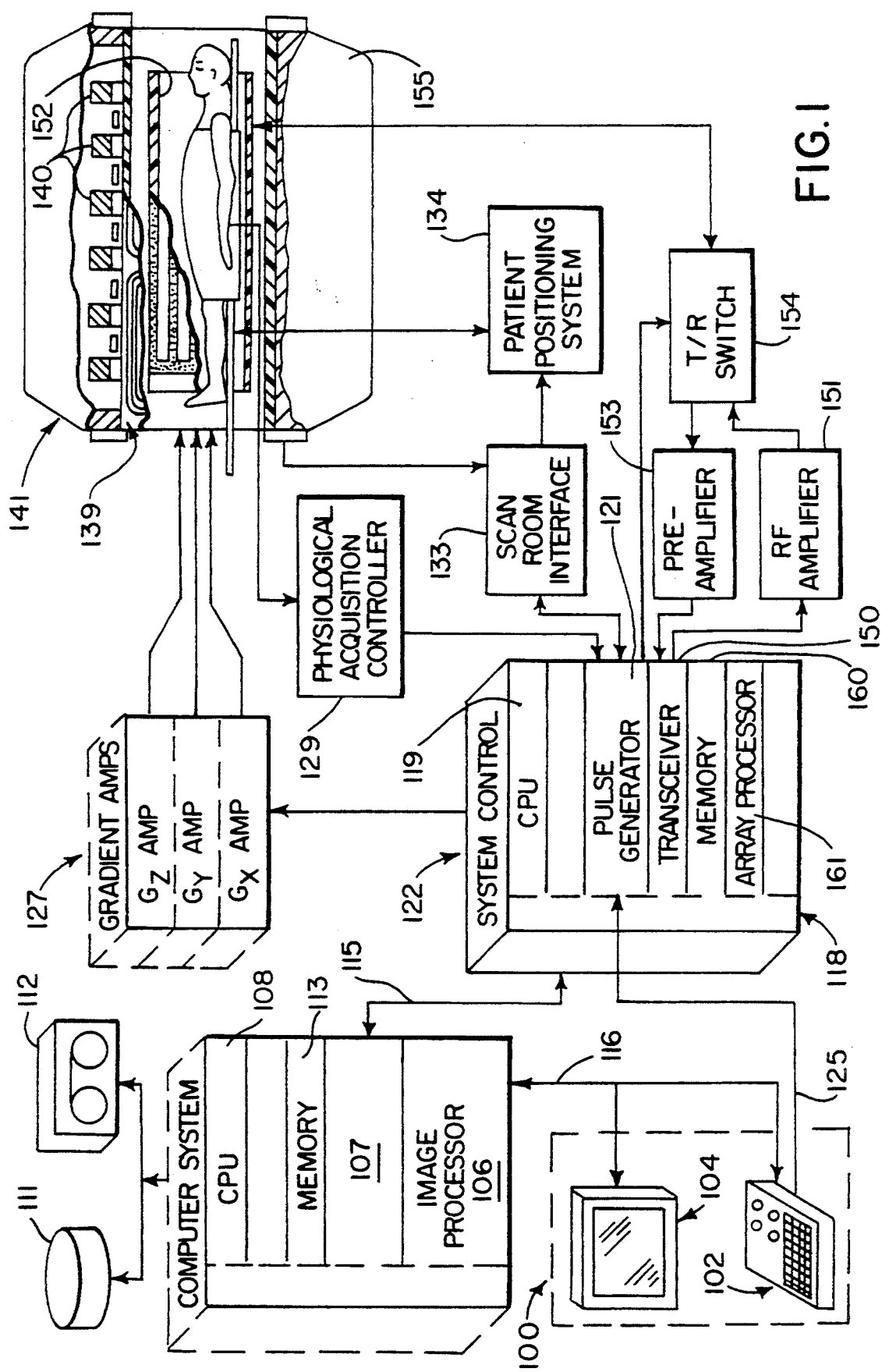
FIG. 1 is a block diagram of an MRI system which employs the present invention.

Referring first to FIG. 1, there is shown the major components of a preferred MRI system which incorporates the present invention. The operation of the system is controlled from an operator console 100 which includes a keyboard and control panel 102 and a display 104. The console 100 communicates through a link 116 with a separate computer system 107 that enables an operator to control the production and display of images on the screen 104. The computer system 107 includes a number of modules which communicate with each other through a backplane. These include an image processor module 106, a CPU module 108 and a memory module 113, known in the art as a frame buffer for storing image data arrays. The computer system 107 is linked to a disk storage 111 and a tape drive 112 for storage of image data and programs, and it communicates with a separate system control 122 through a high speed serial link 115.

The system control 122 includes a set of modules connected together by a backplane. These include a CPU module 119 and a pulse generator module 121 which connects to the operator console 100 through a serial link 125. It is through this link 125 that the system control 122 receives commands from the operator which indicate the scan sequence that is to be performed. The pulse generator module 121 operates the system components to carry out the desired scan sequence. It produces data which indicates the timing, strength and shape of the RF pulses which are to be produced, and the timing of and length of the data acquisition window. The pulse generator module 121 connects to a set of gradient amplifiers 127, to indicate the timing and shape of the gradient pulses to be produced during the scan. The pulse generator module 121 also receives patient data from a physiological acquisition controller 129 that receives signals from a number of different sensors connected to the patient, such as ECG signals from electrodes or respiratory signals from a bellows. And finally, the pulse generator module 121 connects to a scan room interface circuit 133 which receives signals from various sensors associated with the condition of the patient and the magnet system. It is also through the scan room interface circuit 133 that a patient positioning system 134 receives commands to move the patient to the desired position for the scan.

The gradient waveforms produced by the pulse generator module 121 are applied to a gradient amplifier system 127 comprised of $G_x$, $G_y$ and $G_z$ amplifiers. Each gradient amplifier excites a corresponding gradient coil in an assembly generally designated 139 to produce the magnetic field gradients used for position encoding acquired signals. The gradient coil assembly 139 forms part of a magnet assembly 141 which includes a polarizing magnet 140 and a whole-body RF coil 152. A transceiver module 150 in the system control 122 produces pulses which are amplified by an RF amplifier 151 and coupled to the RF coil 152 by a transmit/receive switch 154. The resulting signals radiated by the excited nuclei in the patient may be sensed by the same RF coil 152 and coupled through the transmit/receive switch 154 to a preamplifier 153. The amplified NMR signals are demodulated, filtered, and digitized in the receiver section of the transceiver 150. The transmit/receive switch 154 is controlled by a signal from the pulse generator module 121 to electrically connect the RF amplifier 151 to the coil 152 during the transmit mode and to connect the preamplifier 153 during the receive mode. The transmit/receive switch 154 also enables a separate RF coil (for example, a head coil or surface coil) to be used in either the transmit or receive mode.

The NMR signals picked up by the RF coil 152 are digitized by the transceiver module 150 and transferred to a memory module 160 in the system control 122. When the scan is completed and an entire array of data has 10 been acquired in the memory module 160, an array processor 161 operates to Fourier transform the data into an array of image data. This image data is conveyed through the serial link 115 to the computer system 107 where it is stored in the disk memory 111. In response to commands received from the operator console 100, this image data may be archived on the tape drive 112, or it may be further processed by the image processor 106 and conveyed to the operator console 100 and presented on the display 104.

Figure 2:
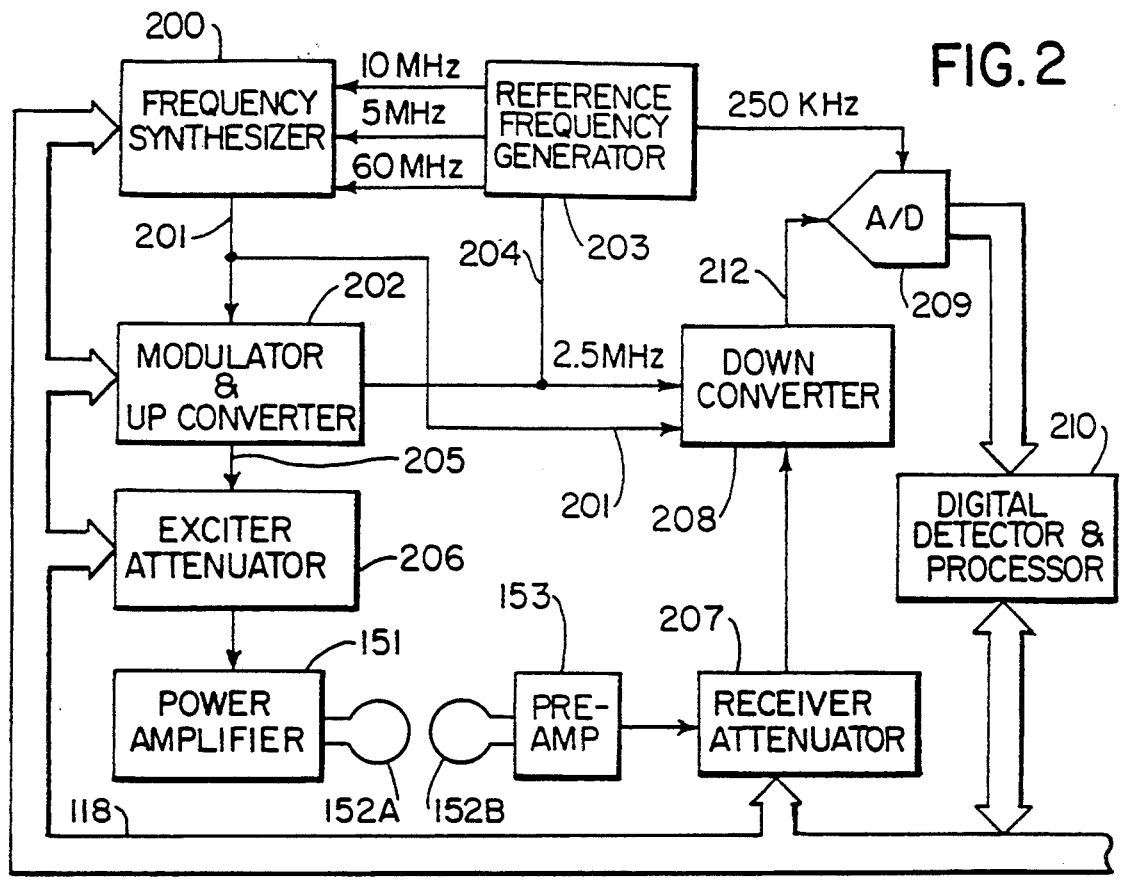
FIG. 2 is an electrical block diagram of the transceiver which forms part of the MRI system of FIG. 1.

Referring particularly to FIGS. 1 and 2, the transceiver 150 produces the RF excitation field B1 through power amplifier 151 at a coil 152A and receives the resulting signal induced in a coil 152B. As indicated above, the coils 152A and B may be separate as shown in FIG. 2, or they may be a single wholebody coil as shown in FIG. 1. The base, or carrier, frequency of the RF excitation field is produced under control of a frequency synthesizer 200 which receives a set of digital signals (CF) from the CPU module 119 and pulse generator module 121. These digital signals indicate the frequency and phase of the RF carrier signal produced at an output 201. The commanded RF carrier is applied to a modulator and up converter 202 where its amplitude is modulated in response to a signal R(t) also received from the pulse generator module 121. The signal R(t) defines the envelope of the RF excitation pulse to be produced and is produced in the module 121 by sequentially reading out a series of stored digital values. These stored digital values may, in turn, be changed from the operator console 100 to enable any desired RF pulse envelope to be produced.

The magnitude of the RF excitation pulse produced at output 205 is attenuated by an exciter attenuator circuit 206 which receives a digital command, TA, from the backplane 118. The attenuated RF excitation pulses are applied to the power amplifier 151 that drives the RF coil 152A. It is the setting of this transmit attenuation command (TA) prior to the execution of the scan which is the subject of the present invention. For a more detailed description of this portion of the transceiver 122, reference is made to U.S. Pat. No. 4,952,877 which is incorporated herein by reference.

Referring still to FIG. 1 and 2 the signal produced by the subject is picked up by the receiver coil 152B and applied through the preamplifier 153 to the input of a receiver attenuator 207. The receiver attenuator 207 further amplifies the signal by an amount determined by a digital attenuation signal (RA) received from the backplane 118.

The received signal is at or around the Larmor frequency, and this high frequency signal is down converted in a two step process by a down converter 208 which first mixes the NMR signal with the carrier signal on line 201 and then mixes the resulting difference signal with the 2.5 MHz reference signal on line 204. The down converted NMR signal is applied to the input of an analog-to-digital (A/D) converter 209 which samples and digitizes the analog signal and applies it to a digital detector and signal processor 210 which produces 16-bit in-phase (I) values and 16-bit quadrature (Q) values corresponding to the received signal. The resulting stream of digitized I and Q values of the received signal are output through backplane 118 to the memory module 160 where they are employed to reconstruct an image.

The 2.5 MHz reference signal as well as the 250 kHz sampling signal and the 5, 10 and 60 MHz reference signals are produced by a reference frequency generator 203 from a common 20 MHz master clock signal. For a more detailed description of the receiver, reference is made to U.S. Pat. No. 4,992,736 which is incorporated herein by reference.

Figure 3:
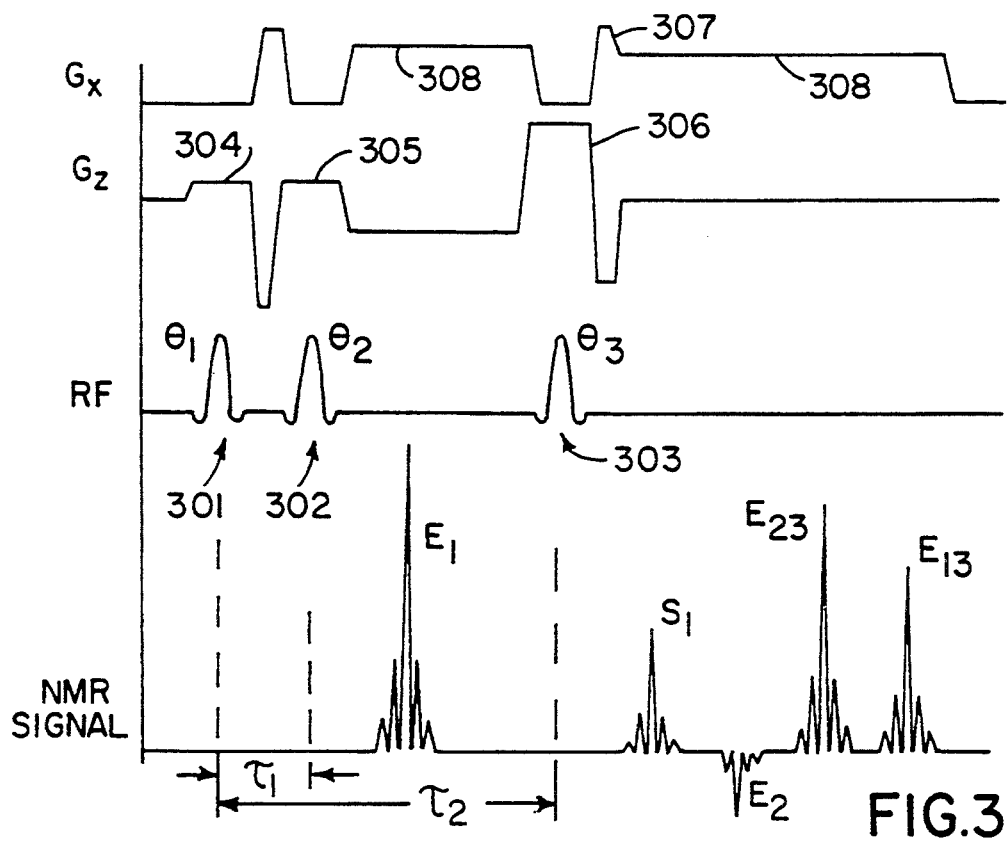
FIG. 3 is a graphic representation of the pulse sequence performed by the MRI system of FIG. 1 to carry out the preferred embodiment of the present invention.

Referring particularly to FIG. 3, the pulse sequence used to measure nutation angle $\theta$ is a modified form of the prior single-measurement pulse sequences. It includes three rf excitation pulses 301, 302, 303 with respective nutation angles $\theta_1$, $\theta_2$, $\theta_3$. The excitation pulses 301–303 are selective and are produced in the presence of a $G_z$ slice select gradient indicated by $G_z$ pulses 304, 305 and 306. It has been discovered that the thickness of the third slice excitation should be approximately one quarter the thickness of the first two slices to improve measurement accuracy without significant reduction in measurement SNR. In the preferred embodiment slice thicknesses of 20 mm, 20 mm and 5 mm are selected for the respective $\theta_1$, $\theta_2$, $\theta_3$ excitations. The negative lobes on the $G_z$ gradient insure that the transverse magnetization is rephased following application of the slice select gradient pulses 304–306.

A $G_x$ readout gradient pulse 308 is applied during the acquisition of the NMR echo signals $E_1$, $S_1$, $E_2$, $E_{23}$ and $E_{13}$ to frequency encode them. This enables the nutation angle to be calculated at specific locations along the x axis in the imaging plane. The echoes from these readout gradients must rephase at the echo times for $S_1$, $E_2$, $E_{23}$ and $E_{13}$ so that they coincide with the echoes from static field gradients caused by polarizing field inhomogeneity and susceptibility. A small $G_x$ gradient pulse 307 is required after the third excitation field pulse to force this alignment of the echoes.

If the time $\tau_2$ between the first and third excitation pulses 301 and 303 is greater than twice the time T1 between the first and second excitation pulses 301 and 302, the five NMR echo signals $E_1$, $S_1$, $E_2$, $E_{23}$ and $E_{13}$ will be produced. To increase SNR and reduce the effect of $T_1$ error $\tau_1$ is reduced to the shortest time possible which is 8 msec. in the preferred embodiment.

Let the phases of the spins after the three rf pulses be $\phi_1$, $\phi_2$, $\phi_3$. These phases depend on the spin positions and time evolved after the rf pulses, and are given by $$\phi_i(t,x) = \gamma x \int_{\tau_{i-1}}^{t} G_x(t')dt' \quad i = 1,2,3 \tag{1}$$

where $\tau_0 = 0$. The echoes will form when the $\phi_i$ have the relationships in the second column in Table A shown below. For constant gradient, the echoes will be positioned at the times given in the third column. Assuming infinite relaxation time prior to the first rf pulse and ignoring diffusion and flow effects, the echo amplitudes are given by $$E_1 = M_0 \sin \theta_1 \sin^2 \tfrac{1}{2}\theta_2 e^{-2\tau_1/T_1} \tag{1}$$

$$S_1 = \tfrac{1}{2} M_0 \sin \theta_1 \sin \theta_2 \sin \theta_3 e^{-2\tau_1/T_2} e^{-(\tau_2-\tau_1)/T_1} \tag{3}$$

$$E_2 = -M_0 \sin \theta_1 \sin^2 \tfrac{1}{2}\theta_2 \sin^2 \tfrac{1}{2}\theta_3 e^{-2(\tau_2-\tau_1)/T_2} \tag{4}$$

$$E_{23} = M_0 \cos \theta_1 \sin \theta_2 \sin^2 \tfrac{1}{2}\theta_3 e^{-2(\tau_2-\tau_1)/T_2} \tag{5}$$

$$E_{13} = M_0 \sin \theta_1 \cos^2 \tfrac{1}{2}\theta_2 \sin^2 \tfrac{1}{2}\theta_3 e^{-2\tau_2/\tau_2} \tag{6}$$

where $M_0$, $T_1$ and $T_2$ have the usual meanings and $\theta_1$, $\theta_2$ and $\theta_3$ refer to the nutation angles of the three rf pulses.

TABLE A

| Echo | Phase Relationship at Echo Center | Time to Echo Center (Constant Gradient) |
|---|---|---|
| $E_1$ | $\phi_2(t) = \phi_1(\tau_1)$ | $2\tau_1$ |
| $S_1$ | $\phi_3(t) = \phi_1(\tau_1)$ | $\tau_2 + \tau_1$ |
| $E_2$ | $\phi_3(t) = \phi_2(\tau_2) - \phi_1(\tau_1)$ | $2\tau_2 - 2\tau_1$ |
| $E_{23}$ | $\phi_3(t) = \phi_2(\tau_2)$ | $2\tau_2 - \tau_1$ |
| $E_{13}$ | $\phi_3(t) = \phi_2(\tau_2) + \phi_1(\tau_1)$ | $2\tau_2$ |

Expressions have been derived which relate the magnitude of NMR echo signals to the nutation angle $\theta_1$ of the first excitation field pulse 301. One of these which has been found most useful is as follows:

$$\frac{S_1(-E_2)^3 E_{13}^2}{E_{23}^6} = \frac{1}{32} \tan^6 \theta_1 \qquad (7)$$

As long as the nutation angles $\theta_2$ and $\theta_3$ are the same, they need not equal the nutation angle 81. This discovery enables flexibility in their values which result in a substantial improvement in measurement SNR. The optimal value for $\theta_2$ and $\theta_3$ is dependant on the selected nutation angle $\theta_1$, but for a wide range in $\theta_1$, the optimal choice is approximated by setting $\theta_2$ and $\theta_3$ equal to twice $\theta_1$. In the preferred embodiment, therefore, when a value for $\theta_1$ is chosen, $\theta_2$ and $\theta_3$ are set to twice that value.

Figure 4:
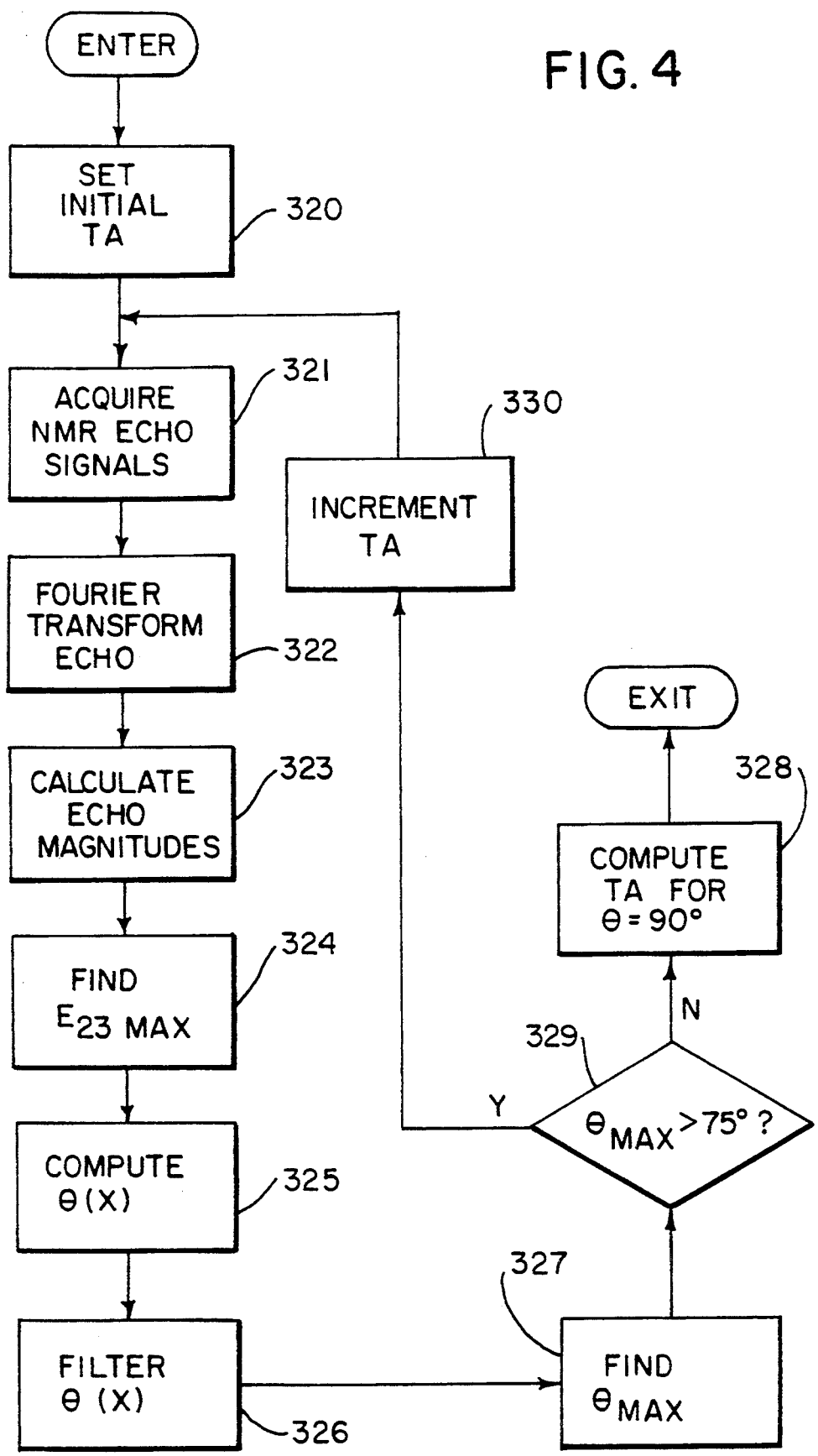
FIG. 4 is a flow chart of the prescan process performed by the MRI system of FIG. 1.

Referring particularly to FIG. 4, the pulse sequence of FIG. 3 is employed in a prescan process which is performed by the MRI system of FIG. 1 to arrive at a value of TA which will produce the desired nutation angle in the image plane. As indicated by process block 320, an initial value for TA is selected based on past experience. The optimal starting TA is a compromise between SNR and the non-linearity of the measurement method due to flip angle inhomogeneity. Experimentally, we obtained the best results when the starting flip angle was between 45° and 65°. This flip angle is large enough to have good SNR and low enough to avoid the strongly non-linear behavior of the measurement when $\theta_1$ is near 90°. As $\theta_1$ approaches 90°, any $B_1$ field inhomogeneities causes inaccuracy in equations 2–5 which can become large, and it becomes difficult to determine the sign of the echo signals. Therefore, we use 55° as the target starting flip angle. The value of TA which will produce this flip angle depends on the type of transmit coil used (e.g. whole body, head coil, extremity coil, etc.) and is based on past experience with similar scans.

The pulse sequence of FIG. 3 is then performed as indicated at process block 321 and the NMR echo signals $S_1$, $E_2$, $E_{23}$ and $E_{13}$ are acquired. Since high spatial resolution is not required, the filter bandwidth in the receiver is reduced to ±4 kHz and only 64 sample points are acquired. The acquired NMR echo signals are then Fourier transformed at process block 322 to indicate their values at 64 locations along the readout gradient axis (x in the preferred embodiment). The magnitude at each location is calculated as the square root of the sum of the squares of the I and Q values at process block 323, and four echo signal magnitude profiles $S_1(x)$, $E_2(x)$, $E_{23}(x)$ and $E_{13}(x)$ are produced.

Prior to computing the nutation angle $\theta_1$ at each location along the readout axis, those locations with unreliable data are filtered out. As indicated at process block 324, this is achieved by finding the maximum magnitude value $E_{23max}$ in the magnitude profile $E_{23}(x)$. Each of the other magnitude values in this profile $E_{23}(x)$ are then compared with $E_{23max}$, and if any are less than one-fifth its magnitude, the nutation angle at that location in each of the four echo signal magnitude profiles is set to zero. Otherwise, as indicated at process block 325, the nutation angle $\theta_1$ produced by the first excitation pulse 301 is calculated at each location (x) as follows:

$$\theta_1(x) = \tan^{-1}[(32 S_1(x) E_2^3(x))^{1/6} / E_{23}(x)]. \qquad (8)$$

The resulting array of values $\theta_1(x)$ are then filtered using an 8-point boxcar filter as indicated at process block 326, and the maximum nutation angle $\theta_{max}$ is selected from this filtered array as indicated at process block 327. This filtering of the nutation angle projection array $\theta_1(x)$ improves the SNR of the measurement.

Referring still to FIG. 4, the measured nutation angle $\theta_{max}$ is considered accurate and is used to compute TA for a 90° nutation angle at process block 328 unless it exceeds 75°. As indicated above, the measurement is non-linear as it approaches a nutation angle of 90°, and the measurement is considered inaccurate if a nutation greater than 75° is produced. This condition is detected at decision block 329 and the entire measurement is repeated after the transmit attenuation (TA) is increased at process block 330. Eventually, the transmit attenuation $TA_{90}$ for a 90° nutation is calculated in tenths of decibels at process block 328 as follows:

$$TA_{90} = TA - 2001 \log_{10}(\pi/2/\theta_{max}) \qquad (9)$$

This method chooses a TA such that the point within the imaging slice with the highest rf magnetic field excitation is flipped or nutated, by 90°. This gives a TA which is in close agreement with the TA yielded by current methods that require 20 to 30 seconds to perform. The SNR of this single-measurement method is not quite as high as slower methods that interpolate multiple measurements, but it is close and it is high enough for practical application with fast pulse sequence scans.

We claim:

1. A method for determining the nutation angle imposed on spins at a location in a slice through a subject being imaged by an MRI system, the steps comprising:
    a) applying a series of three selective excitation field pulses to the subject;
    b) applying slice select magnetic field gradient pulses during the application of the three selective excitation field pulses such that spins located in said slice are nutated;
    c) acquiring a plurality of NMR echo signals ($S_1$, $E_2$, $E_{23}$, $E_{13}$) formed as a result of said nutation of the spins located in said slice;
    d) applying a readout magnetic field gradient pulse to the subject during the acquisition of said NMR echo signals to position encode said NMR echo signals along a readout axis in said slice;
    e) Fourier transforming the acquired NMR echo signals to indicate the magnitude of the respective NMR echo signals at locations along said readout axis; and
    f) calculating the nutation angle at a location along said readout axis using the corresponding magnitude values of the NMR echo signals.

2. The method as recited in claim 1 in which the nutation angle of the second and third selective excitation field pulses are the same, but different from the nutation angle of the first selective excitation field pulse, and the nutation angle calculated in step f) is that produced by the first selective excitation field pulse.

3. The method as recited in claim 2 in which the nutation angle of the second and third selective excitation field pulses is twice the nutation angle of the first selective excitation field pulse.

4. The method as recited in claim 1 in which spins located in a slab much thicker than said slice are nutated by the first and second selective excitation field pulses.

5. The method as recited in claim 4 in which the slab is at least four times as thick as said slice.

6. The method as recited in claim 4 in which the slab has a thickness of approximately 20 mm and the slice has a thickness of approximately 5 mm.

7. The method as recited in claim 1 in which the calculation of nutation angle in step f) is performed at all locations along said readout axis; and the method further includes:
   g) finding the maximum nutation angle $\theta_{max}$ from the nutation angles calculated in step f).

8. The method as recited in claim 7 which includes:
   h) comparing the maximum nutation angle ($\theta_{max}$) with a preselected limit; and
   i) repeating steps a) through g) after reducing the nutation angle of the first selective excitation field pulse if the maximum nutation angle ($\theta_{max}$) exceeds said preselected limit.

9. The method as recited in claim 1 in which the nutation angle ($\theta_1$) is calculated from the expression:

$$\frac{S_1(-E_2)^3 E_{13}^2}{E_{23}^6} = \frac{1}{32} \tan^6\theta_1.$$

* * * * *